(12) United States Patent
Overs

(10) Patent No.: US 6,184,734 B1
(45) Date of Patent: Feb. 6, 2001

(54) DIGITAL PHASE LOCKED LOOP

(75) Inventor: Patrick Overs, Bedfordshire (GB)

(73) Assignee: 3ComTechnologies, Grand Cayman (KN)

( * ) Notice: Under 35 U.S.C. 154(b), the term of this patent shall be extended for 0 days.

(21) Appl. No.: 09/230,530

(22) PCT Filed: Jul. 23, 1997

(86) PCT No.: PCT/GB97/01997

§ 371 Date: May 17, 1999

§ 102(e) Date: May 17, 1999

(87) PCT Pub. No.: WO98/04042

PCT Pub. Date: Jan. 29, 1998

(30) Foreign Application Priority Data

Jul. 23, 1996 (GB) .................................................. 9615422

(51) Int. Cl.[7] .................................................... H03L 7/06
(52) U.S. Cl. ............................ 327/159; 327/150; 327/147

(58) Field of Search ..................................... 327/141, 144, 327/147, 149, 150, 151, 152, 153, 156, 158, 159, 161, 244

(56) References Cited

U.S. PATENT DOCUMENTS

| 4,999,528 | * | 3/1991 | Dudley | 327/152 |
| 5,034,967 | * | 7/1991 | Cox et al. | 375/119 |
| 5,040,193 | * | 8/1991 | Leonowich | 375/87 |

* cited by examiner

*Primary Examiner*—Toan Tran
*Assistant Examiner*—Linh Nguyen
(74) *Attorney, Agent, or Firm*—Van Mahamedi; Wilson Sonsini Goodrich & Rosati

(57) ABSTRACT

A phase locked loop is provided that includes a phase comparator for receiving an incoming signal with which is desired to lock. A loop filter processes a current error signal. An integrator adjusts the output to account for the error. The phase comparator, loop filter and integrator are formed from logic elements.

3 Claims, 3 Drawing Sheets

ડIGITAL PHASE LOCKED LOOP

The present invention relates to a Phase Locked Loop (PLL) implemented in a digital form.

As is well knowm a PLL's function is to provide an oscillating output which is synchronised or locked with an incoming signal. The generation of the output signal is independent of the incoming signal although its phase is controlled by the incoming signal. Therefore a PLL is useful for, for example, generating a clock signal synchrornised with an incoming signal. while the incoming signal may be affected by noise or may be partially corrupted. A typical analog PLL comprises three basic elements: a phase comparator for receiving an incoming signal with which it is desired to lock a loop filter to process a current error signal and an integrator to adjust the output to account for the error.

In particular in communication systems it is necessary to recover a correct clock signal from the received data in order that the received data can be properly understood. In digital communication systems an analogue PLL could be provided for the generation of the clock signal. but implementation of an entirely digital svstem would be simplified by the provision of a digital PLL (DPLL) such that it can be integrated with other parts of the digital device.

The present invention provides a DPLL in which the above elements are implemented digitally such that it can be implemented using standard logic synthesis tools. This means that the invention is not limited to a particular type of chip, for example, but can be easily imnplemented in many digital environments and different format integrated circuits.

The DPLL of the present invention, while advantageously used for recovery of clock signals in a digital data communications system as mentioned above. can also be utilised in other situations where a PLL function is required in a digital environment.

The present invention implements a method of generating an output signal synchronised with an input signal comprising providing a plurality of candidate signals and selecting one of said candidate signals as the output signal according to a phase comparison between the candidate signals and the input signal.

The phase comparison is preferably conducted by sampling the candidate signals according to the input signal and utilizing the results of the sampling to generate an error signal indicative of the phase difference between the currently selected output signal and the input signal. The error signal is then fed back to select a new candidate signal as the output signal.

To avoid "hunting" in the selection feed-back the method preferably further comprises attenuating the error signals progressively to achieve a satisfactory "lock" with the input signal while being unaffected by noise and jitter in the input signal .

The present invention will be better understood from the folowing description of preferred embodiments given by wav of example and in conjunction with the accompanying drawings, in which.

As mentioned above, a typical PLL comprises three basic elements and the present invention implements these digitally, preferably using a hardware descriptor language to describe the behaviour of the elements. As will be described in more detail below, the DPLL comprises a two's complement subtractor as an implementation of a phase comparator, a barrel shifter as an implementation of a loop filter and an accumulator register as an implementation of an intemrator. This approach allows the desiim to use standard logic synthesis tools to create the logic gate representation and does not require hand crafted design or chip layout.

The basic purpose of the PLL is of course to generate an output signal, eg a clock siznal. which is synchronised with an incoming pulse train. In this digital implementation this is done by providing a series of candidate output signals. these all having a frequency equal to the expected input frequency, but being progressively out of phase with each other. These are compared with the input signal with which it is desired to synchronise and an appropriate one of the candidate signals is selected for output.

Figure 1:
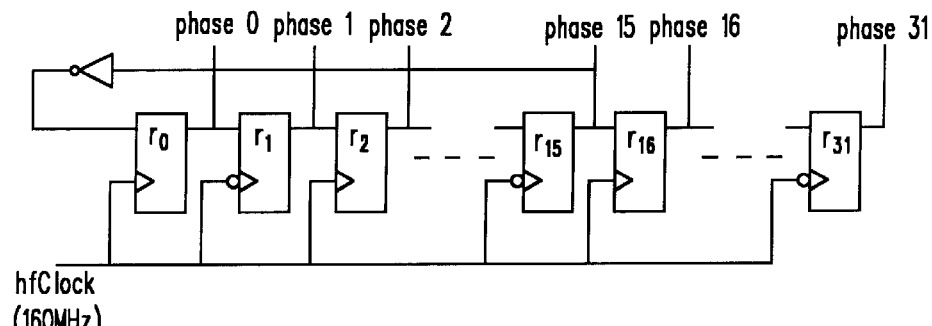
FIG. 1 illustrates the generation of the candidate signals for use in the preferred embodiment.

One method of generating the candidate signals or phases is illustrated in FIG. 1. FIG. 1 shows a 32-bit shift register $r_0, r_1, r_2, \ldots r_{30}, r_{31}$, which is clocked by both edges of a 160 MHz clock. As can be seen from the figure the inverted output from phase 15 is applied as the input to $r_0$ and alternate registers are clocked by the rising and falling edges of the 160 MHz clock. Each of phases 0 to 31 is thus a 10 MHz signal having a 50% duty cycle. the phases being successively out of phase and nominally separated by 3.125 ns. The phase signals thus generated can be used as candidate signals for a number of PLLs. although in the following only one is described.

The high frequency clock may be generated from a 40 MHz clock by an analog PLL which is available in many ASIC technolomies. Altematively a 160 MHz oscillator may be provided.

Alternatively the 32 phases could be generated by a tapped delay line or a high frequency oscillator.

Figure 2:
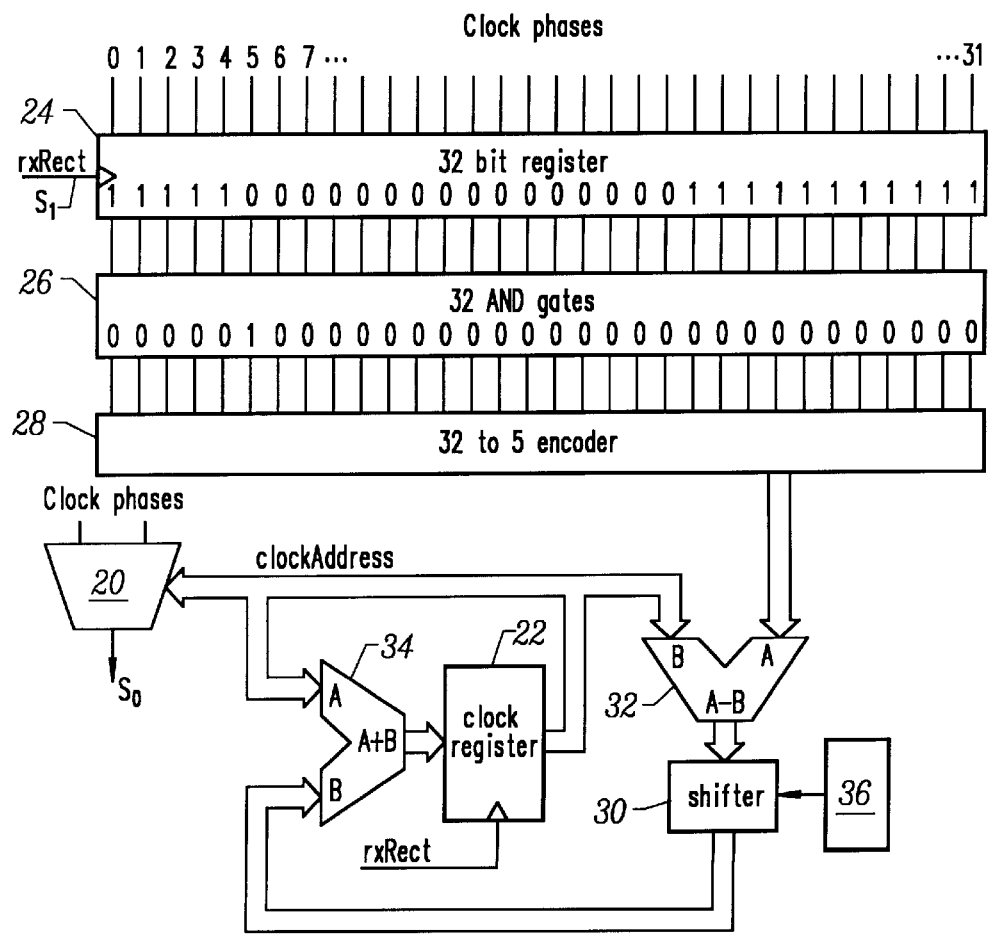
FIG. 2 illustrates the basic operation of the digital phase locked loop according to the preferred embodiment of this invention.

FIG. 2 illustrates the basic operation of the phase locked loop. The device illustrated in FIG. 2 comprises a multiplexer 20 to which the 32 phases generated in FIG. 1 are applied. According to the clock address signal currently in clock register 22. multiplexer 20 selects one of the 32 phases and thus provides the output of the device. $S_0$. The intention of the design is that signal $S_0$ is synchronised with input signal $S_1$.

As shown in FIG. 2. the device also comprises a 32-bit register 24 to which the 32 phases generated in FIG. 1 are also applied. Register 24 is clocked by input signal $S_1$ and thus the data clocked into register 24 is effectively samples of the 32 clock phases at the rising edge of signal $S_1$. As will be appreciated this results in a series of 16 1s and 16 0s being clocked into the register 24. an example of which is illustrated in FIG. 2. In the illustrated case phase 5 is the first of the phases numbered 0 to 31 to have its rising edge after the rising edge of the signal $S_1$. This is represented bv the transition from 1 to 0 in the series of bits in register 24.

The outputs of register 24 are gated by gating means 26 to identify the location of the above mentioned transition. By way of example, gating means 26 may comprise a series of 32 AND gates arranged to "AND" an inverted version of each bit with the previous bit in order to identify the location of the "10" transition in register 24. The outputs of means 26 for the example mentioned above are shown in FIG. 2. These outputs are all 0s except for a single 1 corresponding to phase 5.

The outputs of means 26 are input to encoder 28 which outputs a number. in this case a 5-bit number. indicative of the position of the "1" in the outputs from gating means 26. In the simplest implementation of this arrangement the output from encoder 28 could be used directly as the clock address for reading into register 22 and application to multiplexer 20.

However in practice input sinal $S_1$ is generally subject to jitter and other noise and therefore it is advantageous to introduce some damping into the selection of the correct phase as the output signal. In FIG. 2 this is provided by bit shifter 30. subtracter 32 and adder 34, under the control of 36.

As will be appreciated from the arrangement of FIG. 2, the output from encoder 28 is compared with the current clock address in register 22 by subtracter 32 to generate a phase error signal. This is applied, via shifter 30, to adder 34 and added to the current clock address to generate a new clock address for storage in register 22. In the situation where shifter 30 makes no change in the phase error signal this results in the output of encoder 28 being applied as the new clock address iin register 22.

In more detail the present invent'on clock address is subtracted from the data phase from encoder 28 to give a 5 bit error (twos complement). This error is then used to modify the clock address (up or down accordingly) to achieve a closer sampling phase. The modification process incorporates a gain factor by shifting the error before adding it to the clock address. Initially the gain is unity which results in the phase error being added to the clock address to make it the same as the phase of the first data edge (zero phase start). During the next two bits the gain is high (½) and so large phase errors are quickly averaged out.

However in situations where large amounts of jitter are present, such a large gain could result in continuous "hunting" for the correct phase and so for the next few bit times (eg 5) the gain is set to ⅛ to give some damping. The expectation is that the resulting clock address will be within 1 phase of the correct sampling point at the end of such a locking period. After this it is desired to accommodate small frequency errors whilst rejecting large amounts of transition Jitter. For this reason the gain is reduced to ¹⁄₃₂ after the initial lock-on period.

The gain is implemented as a shift 30 controlled by controller 36 between the phase comparator 36 and the clock address "integrator" 34. The integrator consists of a 10 bit register and an adder. The input phase error is shifted by the gain factor and then added to the 10 bit clock address register. This is also a twos complement number as it has to cope with negative values. Before the resulting address is used to select the clock phase to be used, the value must be converted to a ones complement 5 bit value. This is done by taking the most signfcant 5 bits and adding 10(hex) to it. Thus a full scale negative value of 10(hex) becomes 00 after addition because the sign bi tis lost as overflow. Likewise a mid point 00(hex) becomes 10 after addition and a full scale positive 0F becomes 1F.

As described above the device of this embodiment selects as its output the one of the 32 input phases which is closest in phase to the input signal. The embodiment can however be simply altered such that the output signal is at a predetermined phase relationship form the input signal. This can be achieved by appropriate shifting of the outputs of the gating means 26 or by incorporating an appropriate addition in or after the encoder 28.

The present invention has particular application in providing clock recovery for decoding an incoming data signal in a communications network, eg a LAN. In the following an example of such an application is described in the context of an Ethernet network, which utilizes Manchester encoded data.

10 Mbps Ethernet uses Manchester encoding for data transmission. In Manchester encoding a transition is placed at the centre of each bit cell which represents the value of the bit being sent. A positive transition represents a 1 and a negative transition a 0. In a stream of Manchester encoded data there may or may not be a transition at a bit cell boundary as this depends on the data either side of the boundary.

Figure 3:
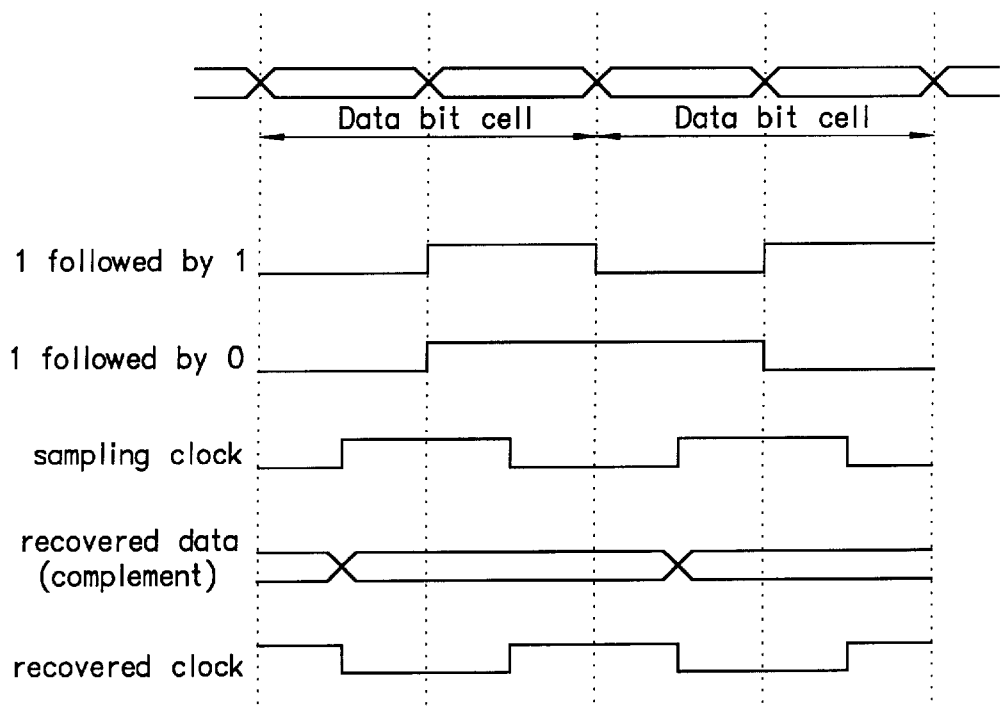
FIG. 3 illustrates the relationship between signals in Manchester encoded Ethernet data.

Manchester encoded data is illustrated in FIG. 3. As can be seen in this figure if a data bit is followed by another of the same value. there is an additional transition at the boundary of the two bit cells. If a data bit is followed by one of the opposite value then there is no return transition. In order to generate a clock from a Manchester encoded stream it is therefore important to establish which transitions in the data stream are active data and which are return transitions and can be ignored.

The clock recovery process for Ethernet involves generating a sampling clock which is centred in one half of the bit cell so that it samples either thru or complement data on each active edge. The arrangement described below generates a sampling clock which is centred in the first half cycle of the data cells and so latches the complement of the true data. This is then inverted to generate true data. The resulting clock which is to be used to clock the recovered data into the next part of the system is the complement of the sampling clock. Thus the data is presented as a NRZ bit stream and the recovered clock is centred in each recovered data bit.

In the arrangement described below, a phase locked loop as described above is used to generate a sampling clock in phase with the received data signal. To achieve this a signal is generated from the received data which has a rising edge corresponding to the mid-cell transitions of the Manchester encoded data. and that signal; designated hereafter rxRect, is used as the input to the PLL.

Figure 4:
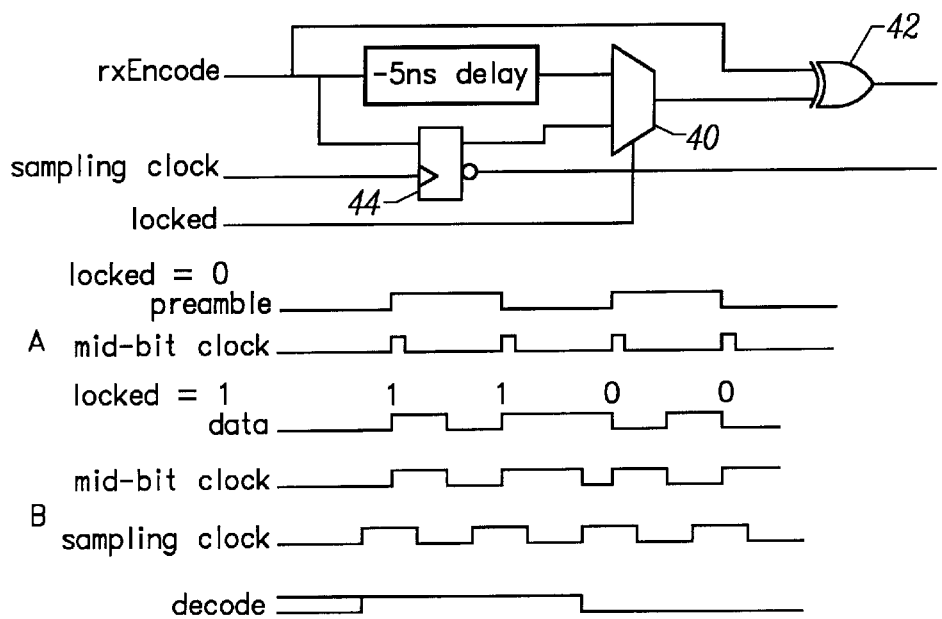
FIG. 4 illustrates the generation of the mid-bit clock from the received Ethernet data.

FIG. 4 illustrates the generation of rxRect from the incoming data rxEncode. This arrangement utilizes the fact that the preamble to each packed in Ethernet comprises a series of alternating 1s and 0s. When this is Manchester encoded it is the case that the only transitions in the received data are at the midcell points. Initially, during the preamble. the PLL is not synchronised with the data and the "locked" signal in FIG. 4 is "0". Thus multiplexer 40 supplies a 5 ns delayed version of rxEncode to exclusive OR gate 42, which takes as its other input the undelaved rxencode. Ex-OR gate 42 thus outputs a 5 ns pulse corresponding to each transition in rxEncode. This is illustrated at FIG. 4A.

After the preamble there may be transitions at the data cell boundaries which must be ignored in the generation of rising edges in rxRect. By this stage the PLL will have locked to the correct phase. as discussed below. and the sampling clock can thus be used together with register 44 to provide an alternative input to ex-OR gate 42. This situation is illustrated by FIG. 4B. The negative transition on the mid-bit clock (rxRect) now occurs either when the return trasition on the data occurs or, if there is no return transition, when the next data bit is sampled. Positive transitions of the mid-bit clock always occur when there is a mid-bit transition on the received bit stream.

Figure 5:
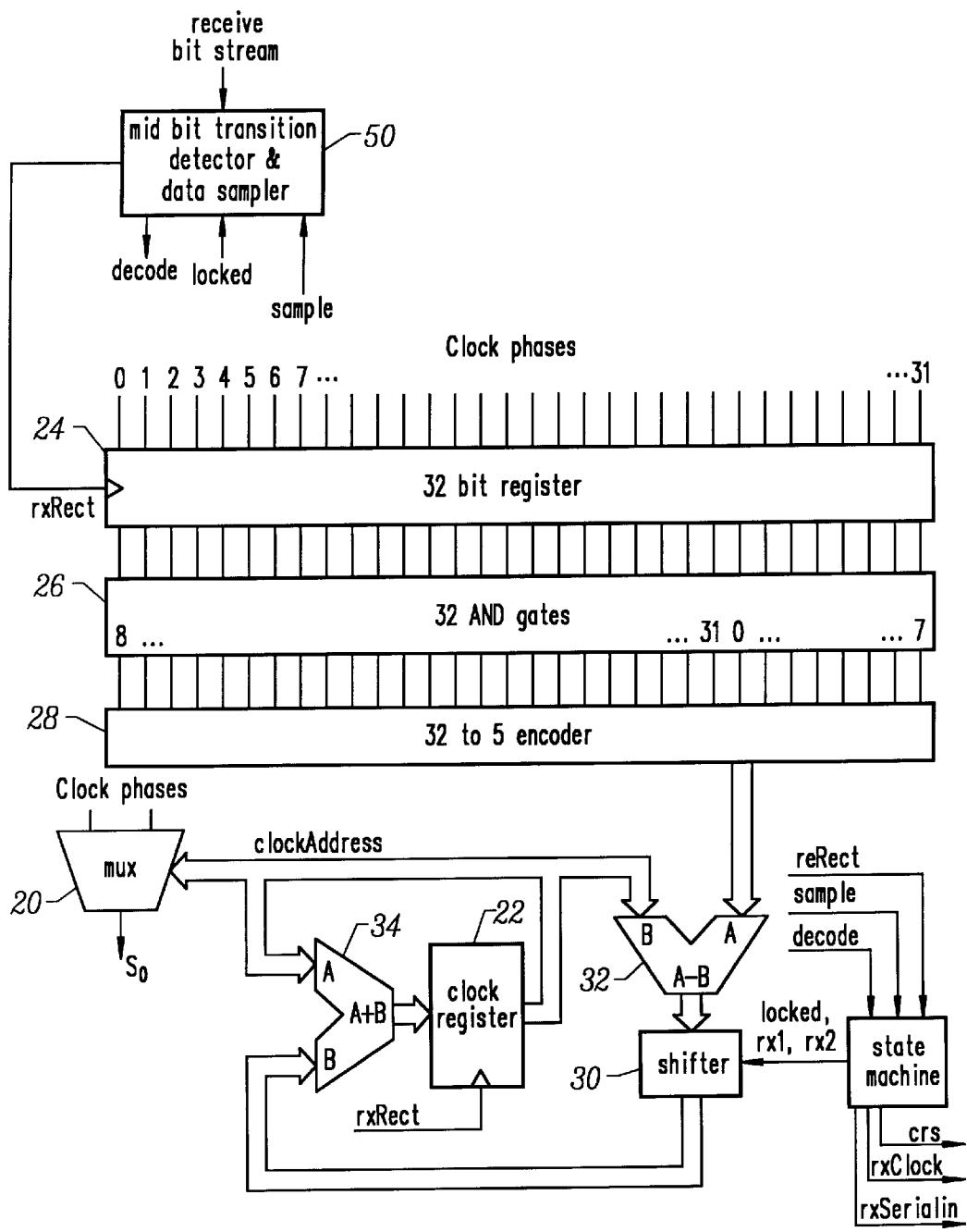
FIG. 5 illustrates the use of the digital phase locked loop according to the preferred embodiment of this invention in the decoding of received Ethernet data.

FIG. 5 illustrates the use of a DPLL as shown in FIG. 2 to decode Manchester encoded data as illustrated in FIG. 3. As will be seen=many parts of FIG. 5 are common with FIG. 2 and the same reference numerals are used to identify corresponding parts.

In FIG. 5 the incoming received data is input to decoder 50. which basically comprises the apparatus illustrated in FIG. 4. The output of ex-OR gate 42 in FIG. 4 is output from decoder 50 and is used as the input to the phase locked loop and thus applied to register 24.

The phase locked loop in FIG. 5 is arranged to generate as the output of multiplexer 20 the sampling clock illustrated in FIG. 3. As is shown in FIG. 3 this clock is desired to be one port of wavelength ahead of the mid-bit clock generated by decoder 50. In this embodiment this is achieved by appropriate connection of the AND gates in gating means 26. In particular, the outputs of the AND gates described above in relation to FIG. 2 are shifted to the left by 8 bits for input to encoding means 28.

The apparatus of FIG. 5 is controlled by state machine 52 which takes and inputs the mid-bit clock generated by decoded 50 as well as the sampling clock output by multiplexer 20. One of the outputs of state machine 52 is the "locked" signal shown in FIG. 4, and this is one of the inputs to decoder 50. At the start of a received data packet the locked sienal is set to zero and thus, as described above. the mid-bit clock comprises a series of 5 nanosecond pulses. State machine 52 also controls shifiing means 30 in order to provide the damping as described above to ensure that the phase locked loop lock into the required phase relationship with the input signal by the end of the received preamble. Once the required synchronisation has occurred the locked signal is set to "1" and decoder 50 is switched to generate the mid-bit clock accordingly as described above.

As mentioned above, the sampling clock generated by the PLL is synchronised to be ¼ wavelength ahead of the mid-bit transition in each received data cell. As illustrated in FIG. 4 this means that it can be used to decode the incoming data by way of register 44. As will be appreciated from FIG. 3, if the incoming data is sampled according to the rising edges of the sampling clock, the samples will be the complement of the data being transmitted in each cell. As illustrated in FIG. 4 these samples generated by register 44 are invcemd on their output to generate a signal designated "decode" which represents the decoded data.

As will be appreciated therefore the digital phase locked loop of the present invention can be simply be and advantageously used in the decoding of received ethernet data.

What is claimed is:

1. A phase locked loop device for generating an output signal having a predetermined phase relationship relative to an input signal, said device comprising:
   means for generating a multiplicity of candidate clocks signals which are all at the same clock fequency but have different phases;
   means for sampling each of said candidate clock signals in response to a predetermined edge of the input signal to produce a plurality of sample values each related to a respective one of said candidate clock signals;
   gating means for comparing sample values corresponding to said candidate clock signals to produce a multiplicity of gate outputs of which one indicates the location of a predetermined change in sample value from one candidate signal to the next;
   an encoder for converting said gated outputs into a coded address related to said location;
   a multiplexer for receiving said candidate clock signals and for selecting for the output signal a candidate clock signal in response to a clock address; and
   clock phase adjustment means including means for comparing said clock address and said coded address to produce a digital error signal and means for modifying said clock address in response to said digital error signal.

2. A device according to claim 1, wherein the clock phase adjustment means includes:
   register for storing a stored clock address;
   means for adding the stored clock address and said digital error signal to modify the stored clock address; and
   means for applying the stored clock address to the multiplexer.

3. A device according to claim 1, and including means for applying a progressively diminishing gain factor to said digital error signal.

* * * * *